(12) United States Patent
Tsuchiya

(10) Patent No.: US 6,812,781 B2
(45) Date of Patent: Nov. 2, 2004

(54) DIFFERENTIAL AMPLIFIER, SEMICONDUCTOR DEVICE, POWER SUPPLY CIRCUIT AND ELECTRONIC EQUIPMENT USING THE SAME

(75) Inventor: Masahiko Tsuchiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/817,193

(22) Filed: Mar. 27, 2001

(65) Prior Publication Data

US 2001/0035789 A1 Nov. 1, 2001

(30) Foreign Application Priority Data

Mar. 31, 2000 (JP) ........................................ 2000-098918

(51) Int. Cl.[7] .............................. G05G 7/12; G05G 7/26
(52) U.S. Cl. ........................ 327/563; 327/540; 330/253
(58) Field of Search ................................ 327/563, 538, 327/540, 541, 543; 330/252, 253

(56) References Cited

U.S. PATENT DOCUMENTS

| 4,757,275 A | * | 7/1988 | Saller et al. ................ 330/257 |
| 4,788,510 A | * | 11/1988 | Wozniak ...................... 327/68 |
| 4,888,559 A | * | 12/1989 | Sevenhans et al. ......... 330/253 |
| 6,005,439 A | * | 12/1999 | Fong .......................... 330/253 |
| 6,060,940 A | * | 5/2000 | Chiozzi ...................... 327/437 |
| 6,064,258 A | * | 5/2000 | Shulman ..................... 330/253 |
| 6,066,985 A | | 5/2000 | Xu |
| 6,310,520 B1 | * | 10/2001 | Walden ....................... 330/253 |

FOREIGN PATENT DOCUMENTS

| EP | 0 809 351 A2 | 11/1997 |
| JP | 59-214311 | 12/1984 |
| JP | 63-003503 | 1/1988 |
| JP | 03-072704 | 3/1991 |
| JP | 07-142940 | 6/1995 |
| JP | 08-307224 | 11/1996 |
| JP | 10-209781 | 8/1998 |
| JP | A-2000-20147 | 1/2000 |
| KR | 1998-070499 | 10/1998 |

OTHER PUBLICATIONS

Giuseppe Ferri, "A 1.2 V CMOS OP–AMP with High Driving Capability," 1998, pp. I–436–I–439.
Peter Andrews, "Class AB Unity–Gain Buffer Amplifier for CMOS Technology," MOTOROLA Technical Developments, Jan. 2000, pp. 176–179.
New U.S. Patent Application (Attorney Docket No. 108096), filed Mar. 27, 2001, Tsuchiya.

* cited by examiner

*Primary Examiner*—Terry D. Cunningham
*Assistant Examiner*—Quan Tra
(74) *Attorney, Agent, or Firm*—Oliff & Berridge, PLC

(57) ABSTRACT

A first differential amplifier circuit includes a first P-type transistor and a second P-type transistor which constitute a current mirror circuit, and operates based on an input voltage $V_{IN}$. A second differential amplifier circuit includes a first N-type transistor and a second N-type transistor forming a current mirror circuit and operates based on the common input voltage $V_{IN}$. A third P-type transistor operable based on a first signal S1 from the first differential amplifier and a third N-type transistor operable based on a second signal S2 from the second differential amplifier are provided. A voltage between these third P-type and third N-type transistors becomes an output voltage $V_{OUT}$. The first differential amplifier circuit has a fourth N-type transistor that is connected in series to the first P-type transistor and a fourth N-type transistor connected in series to the second P-type transistor, wherein a driving ability difference is provided between a pair of transistors forming a first differential pair.

8 Claims, 5 Drawing Sheets

US 6,812,781 B2

DIFFERENTIAL AMPLIFIER, SEMICONDUCTOR DEVICE, POWER SUPPLY CIRCUIT AND ELECTRONIC EQUIPMENT USING THE SAME

Japanese patent application No.2000-98918, filed on Mar. 31, 2000, is hereby incorporated by reference in its entirety.

1. Technical Field

The present invention relates to a differential amplifier having two sets of differential amplifying circuits, a semiconductor device, a power supply circuit, and electronic equipment using the same.

2. Background

A known differential amplifier is shown in FIG. 7, which device has two, first and second differential amplifier circuits 200, 210. The first and second differential amplifier circuits 200, 210 are designed to receive first and second input voltages $V_{IN1}$, $V_{IN2}$ with an offset therebetween as set at a resistive voltage divider circuit 220. A P-type MOS transistor 202 is provided at the rear stage of the first differential amplifier circuit 200, which transistor is driven by a first signal S1 coming from the first differential amplifier circuit 200. Similarly an N-type MOS transistor 212 is provided at the rear stage of the second differential amplifier circuit 210, which transistor is driven by a second signal S2 from the second differential amplifier circuit 210. These PMOS transistor 202 and NMOS transistor 212 are operable to pull together thus defining an output voltage $V_{OUT}$.

In this way, in the above mentioned differential amplifier, a specified output voltage $V_{OUT}$ is generated and issued by providing the offset to input voltages.

SUMMARY

A differential amplifier as one embodiment comprises:
a first differential amplifier circuit having a first differential pair and operating based on a common input voltage; and
a second differential amplifier circuit having a second differential pair and operating based on the common input voltage,
wherein at least one of the first differential pair and the second differential pair is formed from a pair of transistors having a driving ability difference therebetween.

DETAILED DESCRIPTION

Figure 7:
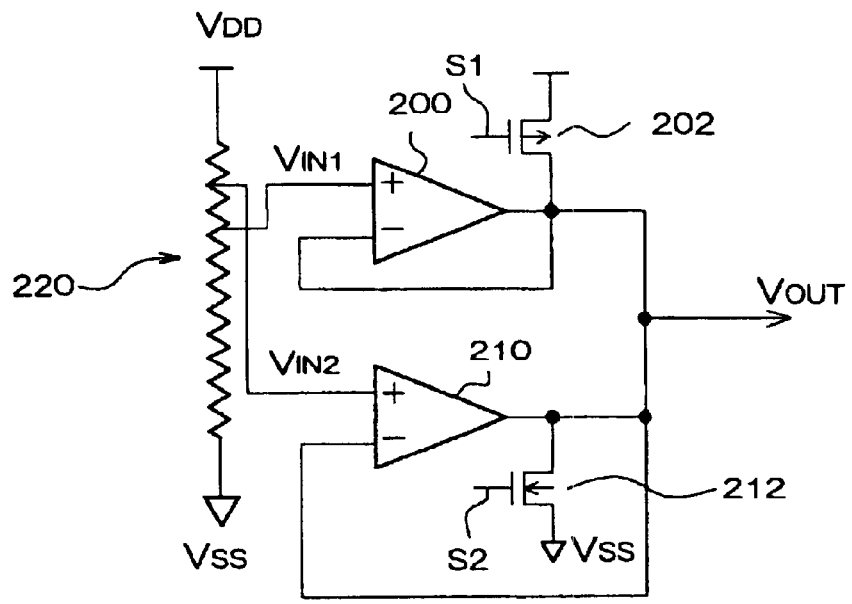
FIG. 7 is a circuit diagram of a differential amplifier with two types of voltages being input thereto.

In case the value of a power supply voltage $V_{DD}$ as applied to the resistance divider circuit 220 shown in FIG. 7 is modified, the significance of such offset between the first and second input voltages $V_{IN1}$, $V_{IN2}$ changes accordingly. One example is that while the offset is set at 0.1 V when the power supply voltage $V_{DD}$ is at 5V, the offset becomes 0.2V when power supply voltage $V_{DD}$ is increased to 10V, wherein the latter value is two times greater than the former. Adversely, when the power supply voltage $V_{DD}$ is increased at 2.5V, the offset becomes the half value, 0.05V.

Note here that the smaller the offset between the first and second input voltages $V_{IN1}$, $V_{IN2}$, the greater the current flowing in the PMOS transistor 202 and NMOS transistor 212 shown in FIG. 7, resulting in a likewise increase in current consumption. Accordingly, the above mentioned device shown in FIG. 7 is encountered with a problem that its power consumption or dissipation increases when the power supply voltage $V_{DD}$ stays low in potential. On the other hand, the offset gets larger when the power supply voltage $V_{DD}$ stays potentially high; thus, a demerit might occur as to unwanted increases in amplitude of an output voltage shown in FIG. 8.

Due to this, the above mentioned differential amplifier shown in FIG. 7 suffers from its inherent limit to the range for modification of the power supply voltage $V_{DD}$, which leads to occurrence of a problem that the application flexibility or applicability is low.

It is therefore an objective of the present invention to provide a differential amplifier, a semiconductor device, and power supply circuit capable of generating a specified output voltage without having to provide any offset between input voltages, along with electronic equipment employing the same.

It is another objective of the present invention to provide a differential amplifier, semiconductor device, and power supply circuit high in applicability capable of suppressing both power consumption increases and output voltage amplitude increases even if power supply voltage is modified.

A differential amplifier as one embodiment comprises:
a first differential amplifier circuit having a first differential pair and operating based on a common input voltage; and
a second differential amplifier circuit having a second differential pair and operating based on the common input voltage,
wherein at least one of the first differential pair and the second differential pair is formed from a pair of transistors having a driving ability difference therebetween.

In accordance with this embodiment, providing a driving ability difference between a pair of transistors forming a differential pair makes it possible to provide an offset between output voltages of the first and second differential amplifier circuits while at the same time making input voltages equal in potential, resulting in achievement of the intended operation similar to that when an offset is provided between the input voltages.

The differential amplifier in accordance with this embodiment, may further comprise:
a first current mirror circuit provided in the first differential amplifier circuit and formed from a first transistor of a primary conductive type and a second transistor of the primary conductive type;
a second current mirror circuit provided in the second differential amplifier circuit and formed from a first transistor of a secondary conductive type and a second transistor of the secondary conductive type;

a third transistor of the primary conductive type which operates based on a first signal from the first differential amplifier; and a third transistor of the secondary conductive type connected in series to the third transistor of the primary conductive type and operating based on a second signal from the second differential amplifier circuit, and a voltage between the third transistor of the primary conductive type and the third transistor of the secondary conductive type may be an output voltage.

At this time, the first differential amplifier circuit may include:

a fourth transistor of the secondary conductive type connected in series to the first transistor of the primary conductive type; and a fifth transistor of the secondary conductive type connected in series to the second transistor of the primary conductive type and having a driving ability different from the fourth transistor of the secondary conductive type, and the fourth transistor of the secondary conductive type and the fifth transistor of the secondary conductive type may form the first differential pair.

In the first differential amplifier circuit thus arranged, the fourth and fifth transistors of the secondary conductive types have a driving ability difference therebetween. Due to this, without having to provide any offset between the input voltages of the first and second differential amplifier circuits, it is possible to permit the first differential amplifier circuit to generate an output voltage with an offset with respect to an output voltage from the second differential amplifier circuit having no driving ability differences between the differential pair constituting transistors, resulting in achievement of the intended operability similar to that in case where an offset is present between the input voltages.

Another advantage is that the absence of any offset between the input voltages ensures avoidance of the above-noted problems faced with the related art caused by possible offset deviation between the input voltages even upon modification of the power supply voltage of a circuit which sets up input voltages.

In the first differential amplifier circuit, a driving ability of the fifth transistor of the secondary conductive type may be set to be greater than a driving ability of the fourth transistor of the secondary conductive type.

Furthermore, the second differential amplifier circuit may includes: a fourth transistor of the primary conductive type connected in series to the first transistor of the secondary conductive type; and a fifth transistor of the primary conductive type connected in series to the second transistor of the secondary conductive type and having a driving ability different from the fourth transistor of the primary conductive type, and the fourth transistor of the primary conductive type and the fifth transistor of the primary conductive type may form the second differential pair. In this configuration, it may be possible to generate an offset between output voltages of the first and second differential amplifier circuits.

With the second differential amplifier circuit in the above configuration, a driving ability of the fifth transistor of the primary conductive type may be set to be greater than a driving ability of the fourth transistor of the primary conductive type.

In order to provide the driving ability difference between the transistors, sizes may be changed. The greater the channel width, the greater the driving ability. The greater the channel length, the smaller the driving ability.

In accordance with another embodiment, it is possible to provide a semiconductor device in the form of single chip at least including the above-stated differential amplifier.

It is also possible to provide a power supply circuit which includes at least one such differential amplifier. It is further possible to provide electronic equipment including such power supply circuit.

Embodiments of the present invention will now be set forth in detail with reference to the accompanying drawings.

First Embodiment

An arrangement and operation of a differential amplifier in accordance with one embodiment of the present invention will be explained with reference to FIGS. 1 to 4.

Arrangement of Differential Amplifier

Figure 1:
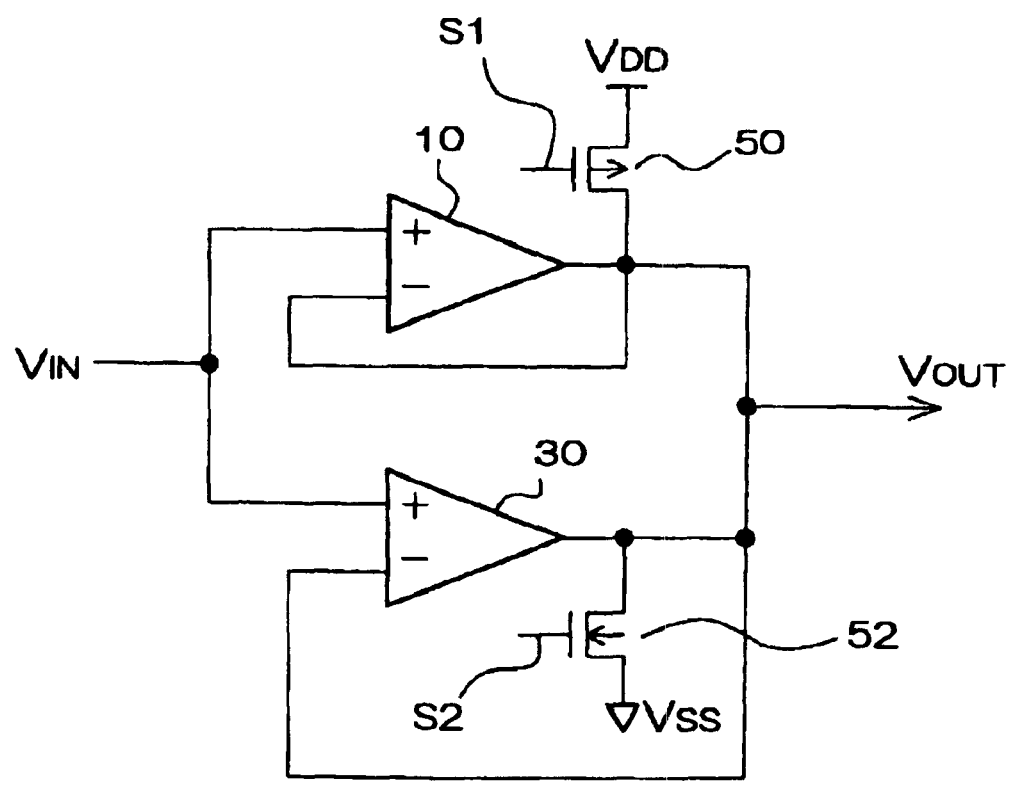
FIG. 1 is a diagram schematically showing a circuit configuration of a differential amplifier in accordance with a first embodiment of the present invention.

Referring to FIG. 1, there is shown a circuit configuration of the differential amplifier in accordance with the embodiment. This differential amplifier is arranged to have a first differential amplifier circuit 10 of the voltage follower type which is operable based on a common input voltage $V_{IN}$ and a second differential amplifier circuit 30 of the voltage follower type operable based on the common input voltage $V_{IN}$.

Figure 2:
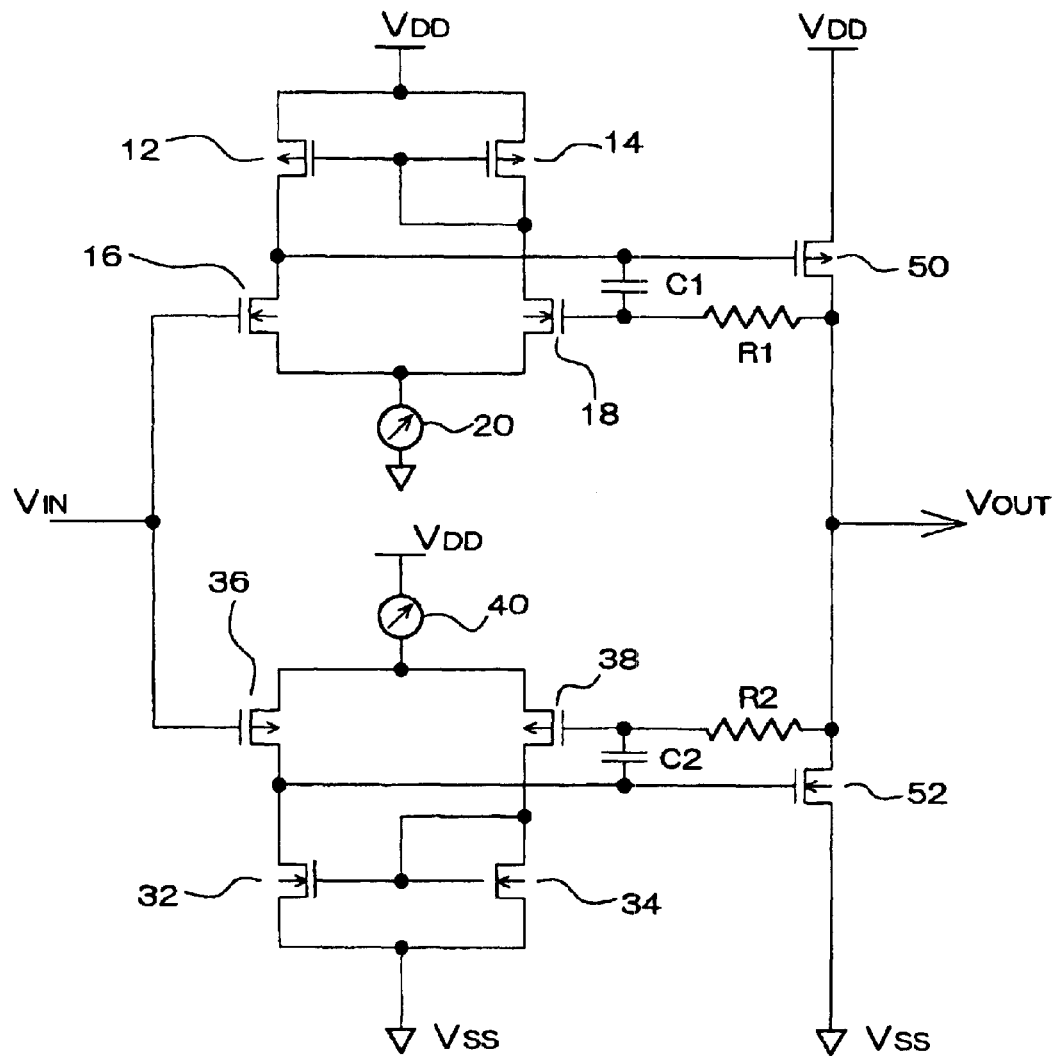
FIG. 2 is a detailed circuit diagram of the differential amplifier shown in FIG. 2.

As shown in FIG. 2 the first differential amplifier circuit 10 includes a MOS transistor 12 of the primary conductive type which is for example P-type (first P-type transistor) and a P-type MOS transistor (second P-type transistor) 14 that constitutes a current mirror circuit together with the P-type MOS transistor 12. These PMOS transistors 12, 14 are the same both in size and in driving ability as each other, thus making up a first current mirror circuit. One example is that the PMOS transistors 12, 14 each measure 50 $\mu$m in channel width w and 7 $\mu$m in channel length L.

The second differential amplifier circuit 30 includes a MOS transistor 32 of the secondary conductive type which is for example N-type (first N-type transistor) and an N-type MOS transistor (second N-type transistor) 34 that makes up a current mirror circuit together with the N-type MOS transistor 32. These NMOS transistors 32, 34 also are the same in size and driving ability as each other to thereby form a second current mirror circuit. For instance, the NMOS transistors 32, 34 each measure 25 $\mu$m in channel width W and 7 $\mu$m in channel length L.

The first differential amplifier circuit 10 further has an N-type MOS transistor 16 (fourth N-type transistor) which is connected in series to the PMOS transistor 12 between power supply voltages $V_{DD}$, $V_{SS}$, and an N-type MOS transistor 18 (fifth N-type transistor) which is connected in series to the PMOS transistor 14 between the power supply voltages $V_{DD}$, $V_{SS}$. Additionally these NMOS transistors 16, 18 are connected through a constant current source 20 to the power supply voltage $V_{SS}$.

The NMOS transistors 16, 18 constitute a first differential pair having a driving ability difference between each of the transistors due to a size difference. One example is that while the NMOS transistors 16, 18 have the equal channel length L of 7 $\mu$m, the channel width W of NMOS transistor 16 is 25 $\mu$m whereas the channel width W of NMOS transistor 18 is 28 $\mu$m. Thus the NMOS transistor 18 is greater in driving ability than NMOS transistor 16. In order to cause the driving ability of NMOS transistor 18 to be greater than that of the NMOS transistor 16, the gate length of NMOS transistor 18 maybe made smaller than that of NMOS transistor 16.

Similarly the second differential amplifier circuit 30 has a P-type MOS transistor 36 (fourth P-type transistor) as connected in series to the NMOS transistor 32 between the power supply voltages $V_{DD}$, $V_{SS}$, and a P-type MOS transistor 38 (fifth P-type transistor) which is series-connected to the NMOS transistor 34 between the power supply voltages $V_{DD}$, $V_{SS}$. Note that PMOS transistors 36, 38 are connected via a constant current source 40 to the power supply voltage $V_{DD}$.

These PMOS transistors 36, 38 are different in size and driving ability from each other so that these make up a second differential pair. One example is that while the PMOS transistors 36, 38 have the equal channel length L of 7 μm, the channel width w of PMOS transistor 36 is 50 μm whereas the channel width W of PMOS transistor 18 is 55 μm. Thus, the PMOS transistor 38 is greater in driving ability than PMOS transistor 36. To make the driving ability of PMOS transistor 38 be greater than that of the PMOS transistor 36, the gate length of PMOS transistor 38 may be made smaller than that of PMOS transistor 36.

As shown in FIGS. 1 and 2, there are provided a P-type MOS transistor (third P-type transistor) 50 operable based on a first signal $S_1$ from the first differential amplifier 10 and an N-type MOS transistor (third N-type transistor) 52 operable based on a second signal $S_2$ from the second differential amplifier 30.

These PMOS transistor 50 and NMOS transistor 52 are connected in series together between the power supply voltages $V_{DD}$, $V_{SS}$ causing a voltage between PMOS transistor 50 and NMOS transistor 52 to become an output voltage $V_{OUT}$ of this differential amplifier.

Additionally as shown in FIG. 2, the first and second amplifier circuits 10, 30 are provided with oscillation prevention capacitors C1, C2 and static electricity protection resistors R1, R2.

Operation of Differential Amplifier

Figure 8:
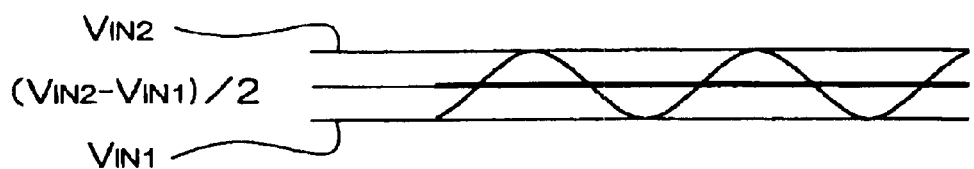
FIG. 8 is an explanation diagram of an output voltage $V_{OUT}$ of the device shown in FIG. 7.

As shown in FIG. 7, an output voltage $V_{OUT}$ of the differential amplifier operating based on first and second input voltages $V_{IN1}$, $V_{IN2}$ becomes a voltage which is stable at an intermediate voltage $(V_{IN}-V_{IN2})/2$ in the stable state or, alternatively, a voltage that varies or "swings" between the voltage $V_{IN1}$ and voltage $V_{IN2}$ with the intermediate voltage being as a boundary as shown in FIG. 8.

The differential amplifier of this embodiment is such that while letting the common input voltage $V_{IN}$ be input to the first and second differential amplifier circuit 10, 30, driving ability differences are provided between the two transistors 16, 18 and between transistors 36, 38, which make up the differential pairs of the first and second differential amplifier circuits 10, 30. Whereby, the first differential amplifier circuit 10 side operates causing a first output voltage $V_{OUT1}$ to become the output voltage $V_{OUT}$ whereas the second differential amplifier circuit 30 side operates causing a second output voltage $V_{OUT2}$ to become the output voltage $V_{OUT}$.

Figure 3:
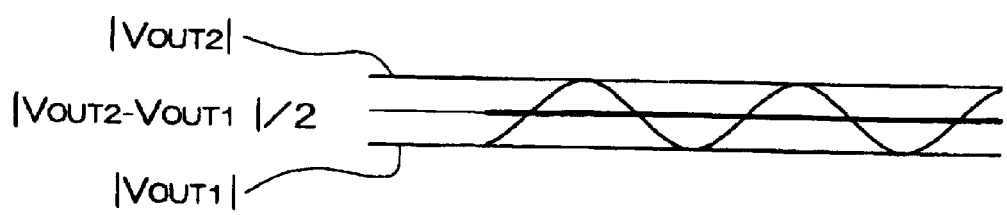
FIG. 3 is a diagram for explanation of an output voltage $V_{OUT}$ of the differential amplifier shown in FIG. 2.

Actually, since output lines of the first and second differential amplifier circuits 10, 30 are electrically shorted, the output voltage $V_{OUT}$ of the differential amplifier becomes a voltage that is potentially stabilized at its intermediate voltage $|V_{OUT1}-V_{OUT2}|/2$ (same as the input voltage $V_{IN}$) or alternatively a voltage that varies or swings between the first output voltage $V_{OUT1}$ and second output voltage $V_{OUT2}$ with the intermediate voltage being as a boundary as shown in FIG. 3.

In this way, according to the differential amplifier of this embodiment, it is possible to obtain the intended output similar to that of the traditional differential amplifier with two kinds of input voltage being input thereto, while at the same time permitting the common input voltage to be input to the first and second differential amplifier circuits 10, 30.

Here, in the first differential amplifier circuit 10, a gate voltage of the P-type transistor 50 is controlled in such a way as to derive an output voltage $V_{OUT1}$ which is lower in potential than the input voltage $V_{IN}$. At the first differential amplifier circuit 30, a gate voltage of the N-type transistor 52 is controlled in such a way as to output an output voltage $V_{OUT2}$ which is higher than the input voltage $V_{IN}$.

Such control operation will be explained below. First, in the first differential amplifier circuit 10, the PMOS transistors 12, 14 constituting the current mirror circuit are the same in driving ability as each other so that currents flowing in NMOS transistors 16, 18 become the same as each other when the first differential amplifier circuit 10 is made stable.

Supposing here that the two NMOS transistors 16, 18 are the same in driving ability as each other, an output voltage of the first differential amplifier circuit 10 at this time is equal to the input voltage $V_{IN}$. Let the gate potential of the PMOS transistor 50 in this event be V1.

With this embodiment, there is a driving ability difference between the two NMOS transistors 16, 18, wherein the driving ability of NMOS transistor 18 is higher than that of NMOS transistor 16.

Accordingly, in the event that the same current flows in the NMOS transistors 16, 18, a voltage between the gate and source (gate-source voltage) of the NMOS transistor 18 is advantageously lower a gate-source voltage of the NMOS transistor 16.

Due to this, unless the outputs of the first and second differential amplifier circuits 10, 30 are electrically shorted together, the output voltage $V_{OUT1}$ of the first differential amplifier circuit 10 becomes lower than the input voltage $V_{IN}$.

Actually, however, the outputs of the first and second differential amplifier circuits 10, 30 are shorted together; thus, the gate-source voltages of the NMOS transistors 16, 18 become equal to each other in the stable state in which the same current flow in the NMOS transistors 16, 18. At this time the same current flows in the NMOS transistors 16, 18 irrespective of the fact that the NMOS transistor 18 has its driving ability to flow therein an increased amount of current. Due to this, the gate potentials of PMOS transistors 12, 14 become lower than the above-noted gate potential V1, resulting in the gate potential of PMOS transistor 50 becoming potentially higher than the aforesaid potential V1.

Thus the gate-source voltage of the PMOS transistor 50 becomes lower causing a current flowing in PMOS transistor 50 to decrease resulting in achievement of low consumption.

On the other hand, in the second differential amplifier circuit 30 also, due to the same reason, the gate-source voltage of the NMOS transistor 52 gets lower causing a current flowing in NMOS transistor 52 to decrease, which results in achievement of low consumption. As a result, it is possible to lessen any current flowing from the power supply voltage $V_{DD}$ via the PMOS transistor 50 and NMOS transistor 52 toward the power supply voltage $V_{SS}$ side.

From the foregoing, it is possible in this embodiment to output the same voltage as the output voltage $V_{OUT}$ of the differential amplifier shown in FIG. 7 without having to offset input voltages while simultaneously enabling accomplishment of low power consumption.

Second Embodiment

In this second embodiment a differential pair is formed of the PMOS transistors 36, 38 in a manner such that a driving ability difference is provided only between the NMOS transistor 16 and NMOS transistor 18 of the first differential amplifier circuit 10 while eliminating provision of any driving ability difference between the PMOS transistor 36 and PMOS transistor 38 of the second differential amplifier circuit 30.

In this case, although a voltage of 4V is obtained as the output voltage $V_{OUT2}$ of the second differential amplifier circuit 30 when letting the input voltage $V_{IN}$ be 4V by way of example, a voltage lower than 4V is obtained as the output voltage $V_{OUT1}$ of the first differential amplifier circuit 10 due to the fact that the NMOS transistor 18 is greater in driving ability than the NMOS transistor 16, thereby enabling obtainment of an offset between the output voltages $V_{OUT1}$, $V_{OUT2}$ in a way similar to that in the first and second embodiments.

Adversely it may also be possible to provide a driving ability difference only between the PMOS transistor 36 and PMOS transistor 38 of the second differential amplifier circuit 20 without providing any driving ability difference between the NMOS transistor 16 and NMOS transistor 18 of the first differential amplifier circuit 10.

Third Embodiment

An explanation will next be given of a power supply circuit of a liquid crystal display device in accordance with a third embodiment of the present invention with reference to FIGS. 4 to 6.

Arrangement and Operation of LCD Device

Figure 4:
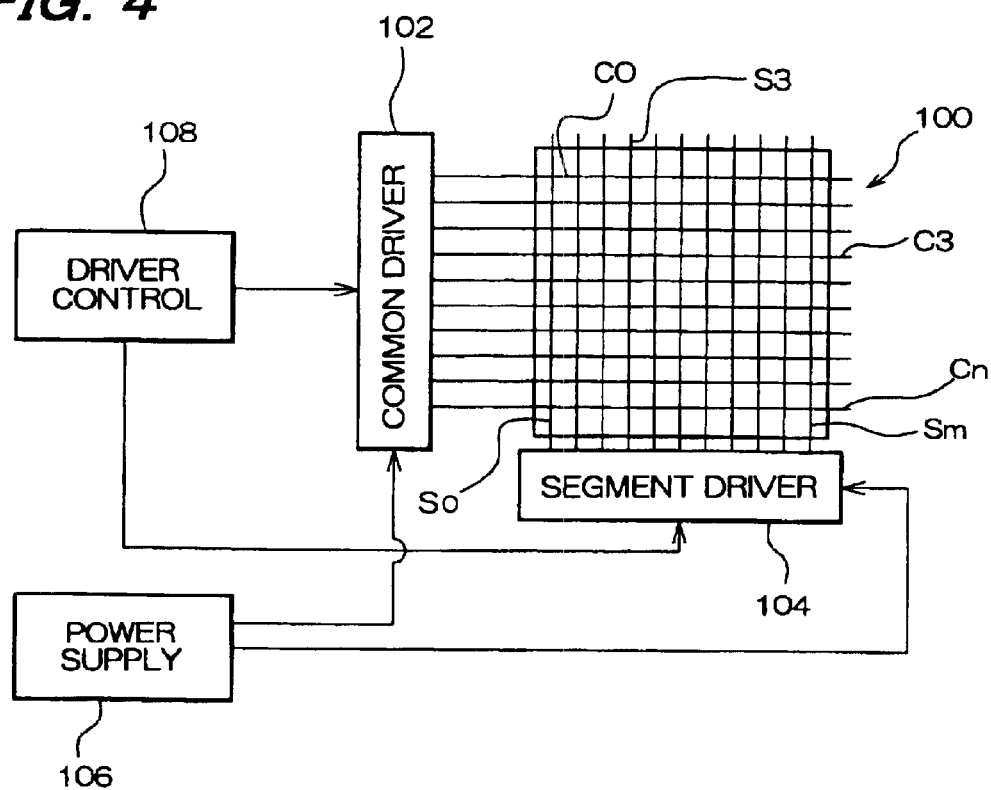
FIG. 4 is a schematic explanation diagram of a liquid crystal display device in accordance with a third embodiment of the invention.

FIG. 4 shows a configuration of main part of the liquid crystal display device. In FIG. 4, a liquid crystal display section, e.g. simple matrix type liquid crystal display section 100, is arranged to include a first substrate with common electrodes C0 to Cm formed thereon, a second substrate with segment electrodes S0 to Sn formed thereon, and a layer of liquid crystal material as sealed and interposed between the first and second substrates. A single one of the common electrodes and one of the segment electrodes cross over each other at an intersection, which becomes a display picture element or "pixel." The liquid crystal display section 100 has a prespecified number of pixels, which is given as (m+1)×(n+1).

Note that the liquid crystal display device in accordance with the second embodiment may also employ other liquid crystal display sections such as an active-matrix liquid crystal display device or else in place of the simple-matrix liquid crystal display section 100.

The common electrodes C0 to Cm are connected with a common driver 102 whereas the segment electrodes S0 to Sn are with a segment driver 104. These common driver 102 and segment driver 104 receive specified voltages as supplied from a power supply circuit 106 for selectively supplying, based on signals from a drive control circuit 108, such specified voltages to the common electrodes C0 to Cm or segment electrodes S0 to Sn.

Figure 5:
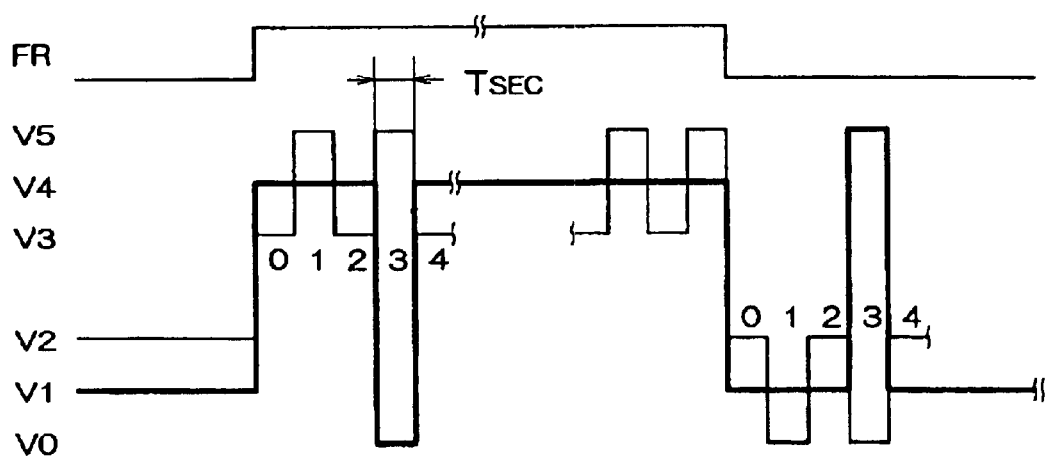
FIG. 5 is a waveform diagram showing drive waveforms of the liquid crystal display device shown in FIG. 4.

Here, there is shown in FIG. 5 one example of drive waveforms within a frame period for selection of a common electrode C3 of the liquid crystal display section 100 shown in FIG. 4.

In FIG. 5, bold line is used to designate a drive waveform as supplied from the common driver 102 to respective common electrodes C0 to Cm whereas thin line indicates a drive waveform being supplied from the segment driver 104 to a respective one of the segment electrodes S0 to Sn.

As shown in FIG. 5 the drive waveform as supplied from the common driver 102 changes among voltages V0, V1, V4 and V5. On the other hand the drive waveform supplied from the segment driver 104 varies among voltages V0, V2, V3 and V5.

Arrangement of Power Supply Circuit

Figure 6:
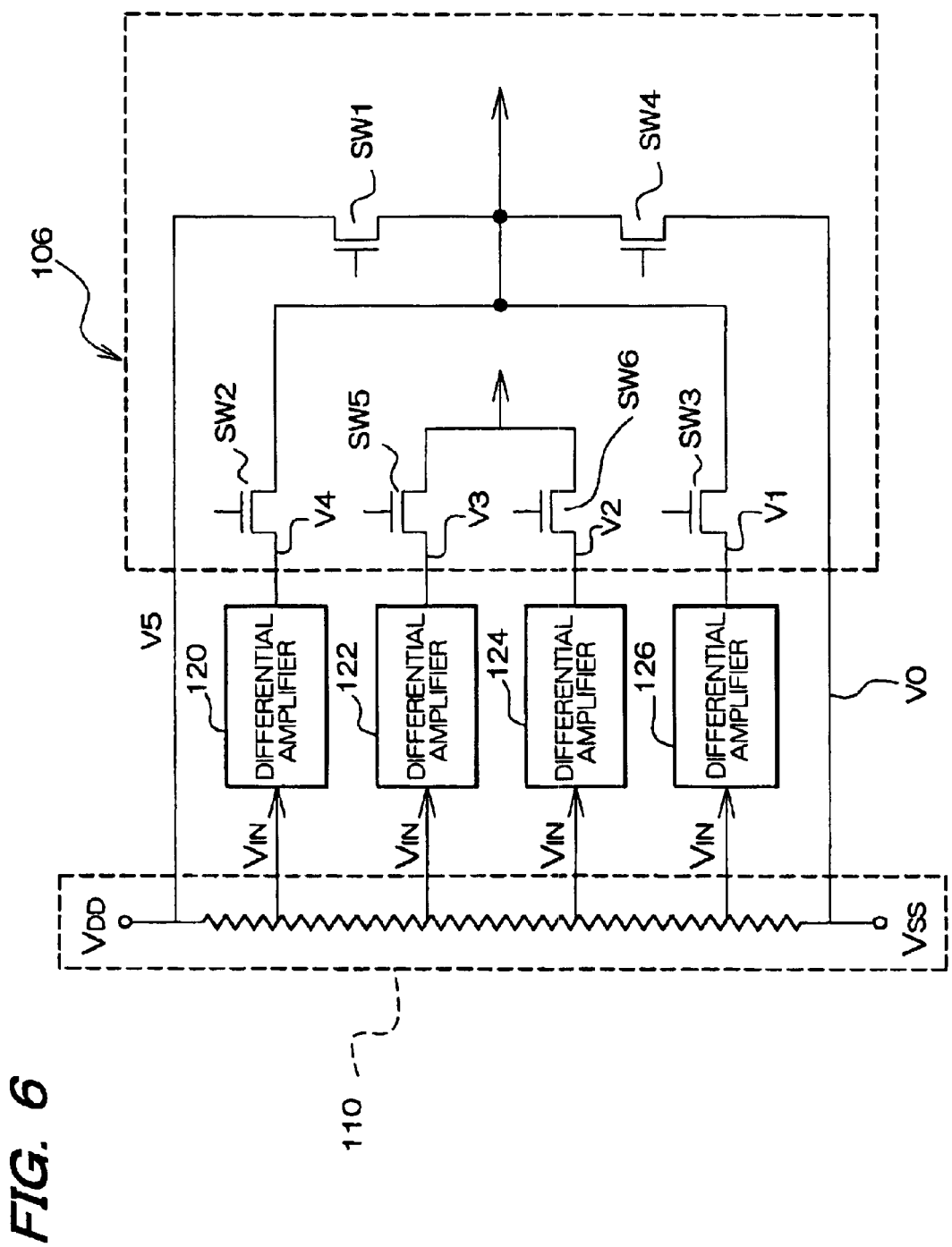
FIG. 6 is a circuit diagram of a power supply circuit for use in the liquid crystal display device shown in FIG. 4.

FIG. 6 shows details of the power supply circuit 106 shown in FIG. 4. As shown in FIG. 6, turning any two of switches SW1 to SW6 on makes it possible to select one of the voltages V0, V1, V4, V5 being supplied to the common driver 102 and one of the voltages V0, V2, V3, V5 as supplied to the segment driver 104.

Here, the power supply voltage $V_{DD}$ is used as the voltage V5; power supply voltage $V_{SS}$ is used as the voltage V0; and, the voltages V4 to V1 are generated by resistive voltage division of a voltage (V5 minus V0). To this end, the power supply circuit 106 has a resistance type potential divider circuit 110 and four separate differential amplifiers 120, 122, 124, 126. The four differential amplifiers 120 to 126 receive input voltages $V_{IN}$ of different levels as input thereto via the resistance divider circuit 110 respectively and then output as their output voltages respective one of V4, V3, V2 and V1. And these four differential amplifiers 120 to 126 each have the arrangement of FIG. 2. Additionally the power supply circuit 106 shown in FIG. 6 is configurable as a discrete or "stand-alone" component or, alternatively, into the form of a single chip IC with the common driver 102 and segment driver 104 shown in FIG. 4 being integrated together.

Operation of Power Supply Circuit

The operation of the differential amplifier as has been explained with reference to FIG. 2 may also be applied with no substantial changes to an operation of a respective one of differential amplifiers 120 to 126 shown in FIG. 6, which output based on different single input voltages $V_{IN}$ the voltages V1 to V4 as the output voltage $V_{OUT}$ respectively.

For example, when the switch SW3 of FIG. 6 turns on, an output line of the differential amplifier 126 is electrically shorted via the common driver 102 to the common electrode C3 of the liquid crystal display section 100. At this time a voltage of the common electrode has been the voltage V5 due to polarity inversion driving as shown in FIG. 5, such shorting results in the output voltage $V_{OUT}$ of differential amplifier 126 potentially dropping down below the voltage V1. However, this output voltage $V_{OUT}$ is caused to potentially rise due to the operation of the differential amplifier and then rapidly become stable at the voltage V1. The remaining differential amplifiers 120 to 124 each operate in a similarly way to that discussed above, except that the input voltage $V_{IN}$ and output voltage $V_{OUT}$ are different in value.

In this way, according to the power supply circuit 106 for use with the liquid crystal display device in accordance with this embodiment, it is possible to output respective output voltages $V_{OUT}$ (V1 to V4) upon merely inputting of single-input voltages $V_{IN}$ to the differential amplifiers 120 to 126 respectively.

Here, comparing it with the differential amplifier shown in FIG. 7, in order to set the output voltage $V_{OUT}$ at 4V when the power supply voltage $V_{DD}$ is at 5V in the device of FIG. 7, the first input voltage $V_{IN1}$ is set at 3.95V while letting the second input voltage $V_{IN2}$ be at 4.05V for example with the resultant offset therebetween becoming 0.1V.

In the power supply circuit of the liquid crystal display device, more than one voltage required is variable depending upon a display capacitance(s) to be liquid crystal driven. Here, the duty of a segment waveform shown by thin line in FIG. 5 is determined in accordance with the display pixel number of the liquid crystal display section 100 of FIG. 4. In brief, the greater the display pixel number, the less the selection period $T_{SEC}$ shown in FIG. 5; if it is less then the selection period $T_{SEC}$ can be made longer.

Figure 9:
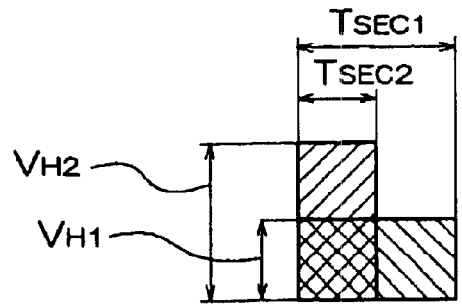
FIG. 9 is a waveform diagram showing different application voltage waveforms for equalization of respective root-mean-square values of voltages as applied to a liquid crystal material.

In either case, it is required to establish or secure equal effective or "net" values of voltages being applied to a layer of liquid crystal material. Accordingly, as shown in FIG. 9, if the selection period is made longer such as $T_{SEC1}$ then it is possible to lower a wave height value $V_{H1}$ of application voltage; on the contrary, if the selection period is shortened such as $T_{SEC2}$ then a wave height value $V_{H2}$ of application voltage must be made higher. In responding thereto, the power supply voltage $V_{DD}$ need be modified.

Here, in case the device shown in FIG. 7 is employed with no substantive alterations added thereto while changing its power supply voltage $V_{DD}$ from 5V to 10V, the first input voltage $V_{IN1}$ is set at 8.9V whereas the second input voltage $V_{IN2}$ is at 9.1V. An offset between the first and second input voltages $V_{IN1}$, $V_{IN2}$ at this time becomes 0.2V, which is two times greater than an offset value of 0.1V obtainable when the power supply voltage $V_{DD}$=5V.

On the contrary, if the power supply voltage $V_{DD}$ is made lower than 5V then the offset between the first and second input voltages $V_{IN1}$, $V_{IN2}$ becomes less than 0.1V.

In this way, in case the resistance divider circuit is co-used with the power supply voltage $V_{DD}$ modified, the resultant offset between the first and second input voltages $V_{IN1}$, $V_{IN2}$ being input to the differential amplifier of FIG. 7 was deviated with a change in power supply voltage value thereof.

Here, the smaller the offset between the input voltages $V_{IN1}$, $V_{IN2}$, the greater the currents flowing in the PMOS trtransistor 202 and NMOS transistor 212 shown in FIG. 7, resulting in an increase in current consumption. Thus, with the device shown in FIG. 7, there has been a serious problem that its consumed current becomes larger when the power supply voltage $V_{DD}$ is low in potential. On the other hand, since the offset increases when the power supply voltage $V_{DD}$ stays high, there is occurred a problem that the output voltage shown in FIG. 8 becomes greater in amplitude.

In contrast, according to this embodiment, the use of a single input voltage $V_{IN}$ permits establishment of any intended offset between the output voltages $V_{OUT1}$, $V_{OUT2}$ as obtained from the first and second differential amplifier circuits 10, 30 owing to the presence of a difference in driving ability between the transistors concerned, resulting in suppression of unwanted offset variability. Consequently the power supply circuit 106 in accordance with this embodiment is capable of being commonly used even upon modification of the power supply voltage $V_{DD}$, thereby advantageously enabling the application flexibility or applicability to increase.

Additionally it would readily occur to those skilled in the art that the above-stated differential amplifiers or power supply circuitry are applicable not only to electronic equipment including liquid crystal display devices, such as a variety of types of electronic equipment including but not limited to portable or "mobile" telephone handsets, game machines and personal computers, but also to various types of other electronic equipment operable upon receipt of potentially stable voltages supplied thereto.

What is claimed is:

1. A differential amplifier comprising:

a first differential amplifier circuit having a first differential pair and operating based on a common input voltage;

a second differential amplifier circuit having a second differential pair and operating based on the common input voltage;

a first current mirror circuit provided in the first differential amplifier circuit and formed from a first transistor of a primary conductive type and a second transistor of the primary conductive type;

a second current mirror circuit provided in the second differential amplifier circuit and formed from a first transistor of a secondary conductive type and a second transistor of the secondary conductive type;

a third transistor of the primary conductive type having a gate connected to a first output line of the first differential amplifier circuit; and a third transistor of the secondary conductive type connected in series to the third transistor of the primary conductive type and having a gate connected to a second output line of the second differential amplifier circuit, wherein at least one of the first differential pair and the second differential pair is formed from a pair of transistors having a driving ability difference therebetween, wherein a third output line connected between the third transistor of the primary conductive type and the third transistor of the second conductive type outputs an output voltage, and the first, the second and the third output lines are shorted together, wherein the first differential amplifier circuit includes:

a fourth transistor of the secondary conductive type connected in series to the first transistor of the primary conductive type and the common input voltage is applied to a gate of the fourth transistor of the secondary conductive type; and a fifth transistor of the secondary conductive type connected in series to the second transistor of the primary conductive type and having a driving ability different from the fourth transistor of the secondary type, wherein the fourth transistor of the secondary conductive type and the fifth transistor of the secondary conductive type form the first differential pair, and the first output line is connected to a gate of the fifth transistor of the secondary conductive type through a first oscillation prevention capacitor and to the third output line through the first oscillation prevention capacitor and a first static electricity protection resistor.

2. The differential amplifier as defined in claim 1, wherein a driving ability of the fifth transistor of the secondary conductive type is set to be greater than a driving ability of the fourth transistor of the secondary conductive type.

3. The differential amplifier as defined in claim 1, wherein the second differential amplifier circuit includes:

a fourth transistor of the primary conductive type connected in series to the first transistor of the secondary conductive type; and a fifth transistor of the primary conductive type connected in series to the second transistor of the secondary conductive type and having a driving ability different from the fourth transistor of the primary conductive type, wherein the fourth transistor of the primary conductive type and the fifth transistor of the primary conductive type form the second differential pair.

4. The differential amplifier as defined in claim 3, wherein a driving ability of the fifth transistor of the primary conductive type is set to be greater than a driving ability of the fourth transistor of the primary conductive type.

5. A semiconductor device comprising the differential amplifier as defined in claim 1.

6. A power supply circuit comprising the differential amplifier as defined in claim 1.

7. Electronic equipment comprising the power supply circuit as defined in claim 6.

8. The differential amplifier as defined in claim 3, wherein the common input voltage is applied to a gate of the fourth transistor of the primary conductive type, and wherein the second output line is connected to a gate of the fifth transistor of the primary conductive type through a second oscillation prevention capacitor and to the third output line through the second oscillation prevention capacitor and a second static electricity protection resistor.

* * * * *